United States Patent [19]

Adams

[11] 4,339,731

[45] Jul. 13, 1982

[54] STABLE, FAST SLEW, PHASE LOCKED LOOP

[75] Inventor: Tello D. Adams, Richardson, Tex.

[73] Assignee: Rockwell International Corporation, El Segundo, Calif.

[21] Appl. No.: 156,534

[22] Filed: Jun. 5, 1980

[51] Int. Cl.$^3$ .................. H03D 13/00; H03L 7/08
[52] U.S. Cl. .................. 331/1 A; 307/516; 307/526; 328/133; 328/134; 331/12; 331/14; 331/27
[58] Field of Search .................. 331/1 A, 11, 12, 25, 331/27, 14; 328/133, 134, 155; 307/511, 514, 516, 525, 526

[56] References Cited

U.S. PATENT DOCUMENTS

| | | | |
|---|---|---|---|
| 3,825,855 | 7/1974 | Basset et al. | 331/11 X |
| 3,944,940 | 3/1976 | Desai | 331/27 X |
| 3,989,931 | 11/1976 | Phillips | 331/27 X |
| 4,048,581 | 9/1977 | Lyberg | 331/25 X |
| 4,191,976 | 3/1980 | Braun | 331/12 X |

OTHER PUBLICATIONS

Messerschmitt, "Frequency Detectors for PLL Acquisition in Timing and Carrier Recovery", IEEE Transactions on Communications, vol. COM-27, Sep. 1979, pp. 1288-1295.

*Primary Examiner*—Siegfried H. Grimm
*Attorney, Agent, or Firm*—Bruce C. Lutz; Howard R. Greenberg; H. Fredrick Hamann

[57] ABSTRACT

A phase locked loop (10) has a phase insensitive frequency comparator (18) including an up/down counter (26) incremented one way by loop frequency pulses (on 28) and incremented the other way by reference frequency pulses (on 30) and which yields error correction signals (on 22 and 24) to adjust loop frequency when the counter overflows or underflows given limits. Timing means (32) is provided at the input (28, 30) to the counter (26) and prevents any clock pulse from being lost by ensuring a sufficient time gap between pulses. A sample and hold phase detector circuit (16) is provided at the data acquisition input to the loop (10) and enables successful acquisition and lock-on even with many zeros between the incoming data bits, and does so with a minimum number of components.

12 Claims, 2 Drawing Figures

STABLE, FAST SLEW, PHASE LOCKED LOOP

TECHNICAL FIELD

The invention relates to phase locked loops, and more particularly to a phase locked loop that will slew fast enough to track jitter but is stable enough to capture a new incoming signal.

BACKGROUND

Phase locked loops are well-known in the art. A long standing trade-off in the design of such loops has been bandwidth (signal to noise ratio) versus stability versus slew rate. On the one hand, it is desirable to have a wide bandwidth in order to ensure capturing of the incoming signal. On the other hand, a narrow bandwidth is desirable to reduce the amount of noise, i.e. provide a high signal to noise ratio. In order to ensure capturing of an incoming signal, a narrow bandwidth has to slew fast enough to adjust to variations in the incoming signal frequency. However, loops with a fast slew rate suffer from instability and may drift too much, i.e. out of the range of the incoming signal and hence be unable to capture such signal.

Loops with a high Q are very stable, however too high a Q is not acceptable because the loop must still be able to track jitter. The shape of an incoming data pulse may have a series of superimposed small ripples and peaks. A square wave pulse shaper in a remote repeater or at the signal input responding to some level of the leading or trailing slope of the pulse may be triggered slightly earlier or later if a small peak or valley occurs at or around the threshold level. This causes a fuzzy area, or jitter, at the leading and trailing straight edges of the generated square wave (Input Data). The loop should be able to adjust to or track this jitter.

A standard LC oscillator affords a high slew rate, but suffers from instability, particularly drifting with component aging and temperature. A crystal oscillator is extremely stable, however it will not slew fast enough to track jitter because of its large "inertia" (Q).

The present invention provides the aforenoted previously incompatible results, and does so in a particularly simple and efficient manner.

SUMMARY

The present invention provides a phase locked loop having stability, narrow bandwidth (for high signal to noise ratio) and fast slew characteristics.

A fast slew phase locked loop, e.g. using an LC oscillator, is stabilized with a phase insensitive frequency comparator. In preferred form, an up/down counter is incremented one way by loop frequency pulses and incremented the other way by reference frequency pulses. When the counter overflows or underflows given upper or lower limits, an error correction signal is applied to the loop to adjust its frequency. The counter acts as a digital integrator for the difference in frequency between the reference clock and the loop clock. The correction signal is phase insensitive.

In further preferred form, timing means are provided at the input to the counter to prevent loss of any clock pulses such that the counter counts each clock pulse regardless of the phase position of the loop and reference clocks.

In another aspect of the invention, a sample and hold phase detector circuit is provided at the data acquisition input to the loop for detecting the phase between loop frequency pulses and incoming data bit pulses and enabling the loop to capture and lock-on to the data signal. The sample and hold phase detector permits successful acquisition and lock even with many zeros between the incoming data bits. The sample and hold phase detector is further particularly advantageous in its simplicity, efficiency, and minimum number of components.

DETAILED DESCRIPTION

Figure 1:
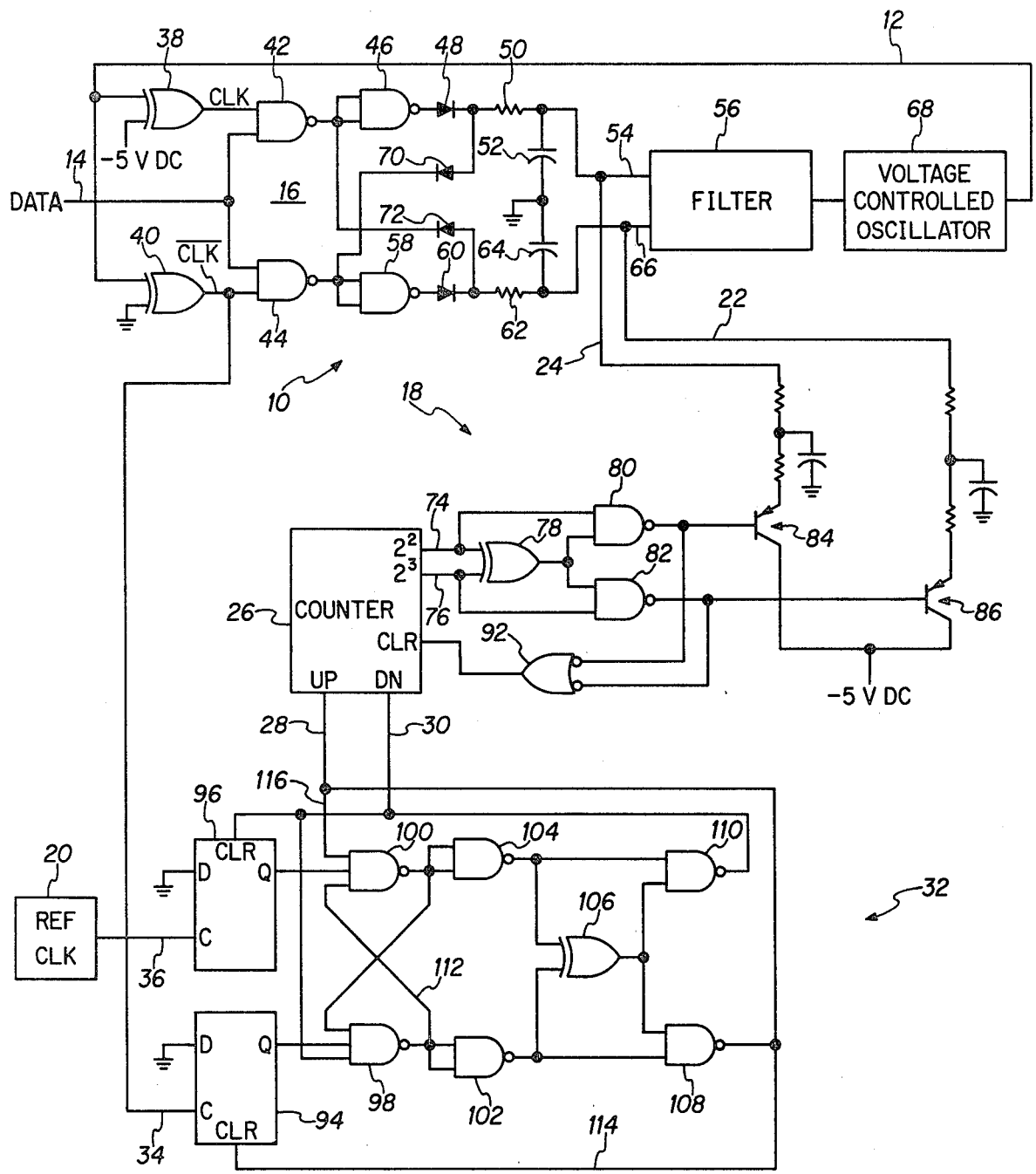
FIG. 1 is a circuit diagram of a phase locked loop and associated circuits constructed in accordance with the invention.

A system overview will be given first, followed by a detailed disclosure. There is shown in FIG. 1 a phase locked loop, generally designated 10, outputting loop frequency clock pulses which are fed back on return line 12 to be gated against data pulses from data signal line 14 at the data acquisition input to the loop through a sample and hold phase detector, generally designated 16. A phase insensitive frequency comparator 18 compares the loop frequency against a reference frequency from reference clock 20 and delivers a correction signal on line 22 or 24 for changing the frequency of loop 10. This phase insensitive frequency comparator 18 includes an up/down counter 26 incremented one way by loop frequency pulses at input 28 and incremented the other way by reference frequency pulses at input 30. Counter 26 has given overflow and underflow set points yielding frequency error signals changing loop frequency. Timing means 32 receives loop frequency pulses at input 34 and reference frequency pulses at input 36 and delivers these pulses to the inputs 28 and 30 of counter 26 with a sufficient time gap therebetween such that all pulses are counted.

Referring now in detail to loop 10, clock signal pulses are delivered via return line 12 in parallel to the inputs of a pair of exclusive OR gates 38 and 40. The other input of gate 38 is tied low to a −5 volt DC power source, and the other input of gate 40 is tied to ground. The resulting outputs of gates 38 and 40 are a pair of clock signals one of which is the inversion of the other, as shown by clock and $\overline{\text{clock}}$ shown in FIG. 2. The outputs of gates 38 and 40 are fed respectively to NAND gates 42 and 44, and the other inputs of these latter gates receive data signals from data input line 14. Gates 42 and 44 thus gate the data signal against the clock signals.

The output of NAND gate 42 is delivered through inverter 46, through diode 48, is RC filtered by RC filter means including resistor 50 and capacitor 52, and is input to one side 54 of a filter 56. The output of NAND gate 44 is delivered through inverter 58, through diode 60, is RC filtered by RC filter means including resistor 62 and capacitor 64, and is delivered to the other input 66 of the filter 56. The output of the filter 56 is delivered to a voltage controlled oscillator (VCO) 68, which may include an LC oscillator. The DC voltages on lines 54 and 66 control the output voltage level of filter 56, which level in turn controls the frequency of clock pulses output by VCO 68 on line 12.

An incoming data pulse on line 14 is input in parallel to gates 42 and 44. The portion of the data signal pulse coincident with the clock signal from the output of gate 38 drives the output of NAND gate 42 low which is inverted high by inverter 46 and delivered through series aiding diode 48 to charge capacitor 52 through resistor 50 and generate the DC voltage on line 54. During the portion of the data signal which is not coincident with the clock pulse from the output of gate 38, the output of gate 42 is high which is inverted low by inverter 46 and blocked by diode 48 from charging capacitor 52. This latter portion of the data signal is coincident with the $\overline{\text{clock}}$ signal from the output of gate 40 and drives gate 44 to yield a low output which is inverted high by inverter 58 and delivered through series aiding diode 60 to charge capacitor 64 through resistor 62 and generate the DC voltage on line 66. Diode 60 blocks current flow during the portion of the data signal which is not coincident with the $\overline{\text{clock}}$ signal.

Figure 2:
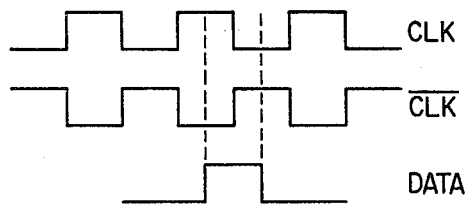
FIG. 2 is a timing diagram illustrating the operation of FIG. 1 for data acquisition.

As shown in FIG. 2, the net result of these operations is to cause the loop frequency pulses, clock and $\overline{\text{clock}}$, to have their edges equidistant from the center of the data pulse, i.e. 90 degrees phase shifted, at which time no net charge is added to or removed from capacitors 52 and 64.

Cross coupled diode means are provided including a diode 70 connected between RC filter means 50, 52 and the output of gate 44 in series aiding direction towards the latter, and a diode 72 connected between RC filter means 62, 64 and the output of gate 42 in series aiding direction towards the latter. Capacitor 52 discharges through diode 70 during the portion of the data signal coinciding with the $\overline{\text{clock}}$ signal. Capacitor 64 discharges through diode 72 during the portion of the data signal coinciding with the clock signal. Diodes 48 and 70 are back biased during portions of the data signal not coinciding with the clock signal, and diodes 60 and 72 are back biased during portions of the data signal not coinciding with the $\overline{\text{clock}}$ signal. Diodes 48, 60, 70 and 72 are all back biased when there is no data pulse, and prevent gates 42 and 44 from causing any current flow to or from the RC filters whereby to hold the charge of the latter until the next data signal pulse.

An advantageous feature of sample and hold phase detector circuit 16 is that it has a symmetrical configuration which compensates for changes caused by temperature or lot to lot variations in the components. In one form, for example, the gates are all on the same chip and track each other thermally. The diodes are chosen from the same lot and will also track. The resistors are used to pass current in both directions alternately, so any value variation is self cancelling and has no average effect. The resistor capacitor network also serves to filter out the high frequency component of the error signal so that it is within the bandwidth acceptable to the following active filter 56.

The sample and hold phase detector 16 permits successful acquisition and lock-on capturing of the incoming data even with many zeros between the data bits. This is achieved with significantly simplified and efficient circuitry utilizing a minimum number of components. Data is gated against a pair of synchronous loop frequency clock pulses and there is generated a pair of DC outputs responsive to the phase therebetween for controlling loop frequency. Energy storage means 52 and 64 are provided for the DC outputs 54 and 66. Selective isolation means 48, 60, 70 and 72 permit current flow to and from the energy storage means in response to data signals, and isolate the energy storage means in the absence of data to sustain the DC outputs for a given time.

Stabilization of the clock pulse frequency on return line 12 of loop 10 is provided by correction signals on lines 22 and 24 which affect the DC voltage levels on lines 54 and 66. These stabilizing correction signals are provided by the phase insensitive frequency comparator 18. Counter 26 is incremented at its up input 28 by loop frequency pulses, derived from the $\overline{\text{clock}}$ signal at the output of gate 40. Counter 26 is incremented the other way, i.e. decremented, by reference frequency pulses at its down input 30 derived from a stable reference clock 20. An overflow upper limit and an underflow lower limit are chosen and incrementation passed either causes the counter to spill over and output a signal which in turn yields a correction signal on line 22 or 24. Such correction signal causes loop 10 to appropriately increase or decrease the frequency of clock pulses output on line 12 until the counted pulse differential between inputs 28 and 30 falls below the set limits.

In one form, the upper and lower count limits are as shown in the table below.

| | $2^3$ | $2^2$ | $1^1$ | $2^0$ | |
|---|---|---|---|---|---|
| DOWN LIMIT → | 1 | 01 | 1 | 0 | |
| | 1 | 0 | 1 | 1 | COUNT |
| | 1 | 1 | 0 | 0 | DOWN |
| | 1 | 1 | 0 | 1 | ⋀ |
| | 1 | 1 | 1 | 0 | |
| | 1 | 1 | 1 | 1 | |
| CLEAR → | 0 | 0 | 0 | 0 | |
| | 0 | 0 | 0 | 1 | |
| | 0 | 0 | 1 | 0 | |
| | 0 | 0 | 1 | 1 | |
| UP LIMIT → | 0 | 1 | 0 | 0 | ⋁ |
| | 0 | 1 | 0 | 1 | |

The two most significant digits, $2^2$ and $2^3$, are output on lines 74 and 76 through an exclusive OR gate 78. Initially, for the first few counts up or down from the starting point all zeros line, there is no output from gate 78 because the two most significant digits, $2^2$ and $2^3$, are either both 1's or both 0's. When the count reaches the up limit (0 1) or the down limit (1 0), the output of gate 78 goes high. Counter 26 thus acts as a digital integrator for the difference in frequency between the loop 10 clock and the reference clock 20.

The output of gate 78 is gated against line 74 through a NAND gate 80, and is gated against line 76 through a NAND gate 82. If the upper set limit of the counter is reached, line 74 is high which together with the high output of gate 78 drives the output of NAND gate 80 low, which in turn pulls the base of an amplifying transistor 84 low causing conduction thereof. Conduction of transistor 84 introduces a correction signal to filter amplifier 56 by reducing the DC voltage level on line 54 via connection 24. If the lower count limit is reached, line 76 is high which in turn drives the output of gate 82 low to turn on a transistor 86 which reduces the DC voltage level on line 66 via connection 22. The same signals input to transistors 84 and 86 are also delivered through inversion input OR gate 92 to clear counter 26 back to its designated starting point in readiness for the next correction cycle.

Timing means 32 are provided for delivering loop frequency pulses on line 28 and reference frequency pulses on line 30 with a sufficient time gap therebetween. Counter 26 requires a finite delay between count pulses. Since the clock pulses of loop 10 and reference 20 have no fixed timing relationship, coincident pulses may cause loss of a count. Timing means 32 resolves time races without losing any pulses.

A pair of D type flip-flops 94 and 96 are clocked at inputs 34 and 36 by the loop frequency in the form of clock pulses from the output of gate 40 and by reference frequency pulses from reference clock 20, respectively. The input pulse that arrives first from either line 34 or line 36 sets its respective flip-flop 94 or 96 whose output passes through a respective NAND gate 98 or 100 which then inhibits the output of the other flip-flop. The output of gate 98 or 100 goes through an additional inverter 102 or 104 and delay circuit gates 106 and 108 or 110 and is input to counter 26. For example, if the pulse on line 34 arrives before the pulse on line 36, then flip-flop 94 is set and its Q output drives gate 98 (assuming the other inputs are the same). The output of gate 98 is cross coupled via connection 112 to the input to NAND gate 100 to inhibit the latter. The output of gate 98 is inverted through inverter 102 and delivered through exclusive OR gate 106 whose output is gated against the output of inverter 102 through NAND gate 108 and delivered to counter 26 as the loop frequency clock pulse input on line 28. This output signal from gate 108 is also delivered via connection 114 to clear flip-flop 94. An additional feedback signal from the output of gate 108 via connection 116 to the input to gate 100 inhibits the other side of the circuit (components 96, 100, 104, 106 and 110) from generating a count pulse on input 30 until some time after the count pulse on input 28 has returned to zero. This time is a function of the path delay. The width of the count pulse input at 28 or 30 is also set by the path delay of the loop in timing means 32. The delay circuit also serves to remove any pulse slivers resulting from the time race at gates 98 and 100.

Counter 26 thus receives the proper inputs with proper timing regardless of the phase position of either the loop clock or the reference clock. Furthermore, no clock pulses are lost, i.e. not counted, because the pulse that arrives second is stored in the other flip-flop until the first one has been counted, followed by counting of the second pulse.

As an example of one use of the present invention, a multiplexer commonly utilizes a phase locked loop in a clock recovery circuit for extracting the clock signal from incoming data. The multiplexer usually includes a stable high speed reference clock which is not an exact multiple of the low speed rate to allow for inaccuracies in the latter. The reference clock sends a reduced rate low speed reference clock signal for clocking the low speed data into the multiplexing circuitry. Stuff requests are used to delete clock pulses from the low speed reference clock signal when necessary to match the incoming data bit rate. Loop 10 may be used in the above noted clock recovery circuit. When loop 10 acquires lock, there is no average frequency difference between the loop clock on 12 and the reference clock 20 due to the stuffing. In this implementation, up/down counting takes place within counter 26 but the excursions are not sufficient enough to spill the counter and no error signal is generated. In this context, then, the frequency stabilizer circuit provided by phase insensitive frequency comparator 18 and timing means 32 operates only when required. Thus, when phase lock is acquired, phase detector 16 has exclusive control of frequency adjustment because the loop frequency and the reference frequency become the same and no correction signals are generated on lines 22 or 24 to alter the DC voltage levels on lines 54 and 66. In the absence of input data, phase insensitive frequency comparator 18 prevents the frequency of loop 10 and VCO 68 from drifting, and keeps the loop frequency close to the reference frequency.

It is recognized that various modifications are possible within the scope of the appended claims.

I claim:

1. In a phase lock loop, the improvement comprising a phase insensitive frequency comparator for comparing the frequency of said loop against a reference frequency for stabilizing the former, wherein said phase insensitive frequency comparator comprises means for counting loop frequency pulses and reference frequency pulses, and means responsive to a given differential between counted pulses for adjusting loop frequency and further wherein said phase insensitive frequency comparator comprises an up/down counter incremented one way by said loop frequency pulses and incremented the other way by said reference frequency pulses, said counter having given overflow and underflow set points yielding error correction signals changing said loop frequency.

2. The invention according to claim 1 wherein said phase insensitive frequency comparator further comprises timing means receiving said loop frequency pulses and said reference frequency pulses and delivering said pulses to said up/down counter with a sufficient time gap therebetween such that all said pulses are counted.

3. In a phase lock loop, the improvement comprising a phase insensitive frequency comparator for comparing the frequency of said loop against a reference frequency for stabilizing the former, and further comprising a sample and hold phase detector for gating data against loop frequency clock pulses and generating a pair of DC outputs responsive to the phase therebetween for controlling loop frequency, and including energy storage means for said DC outputs and selective isolation means permitting current flow to and from said energy storage means in response to data signals and isolating said energy storage means in the absence of data to sustain said DC outputs for a given time.

4. The invention according to claim 3 wherein said phase insensitive frequency comparator comprises means for counting loop frequency pulses and reference frequency pulses, and means responsive to a given differential therebetween for altering the voltage on said DC outputs.

5. In a phase lock loop, the improvement comprising a simple and efficient sample and hold phase detector comprising:

means providing a pair of synchronous loop frequency clock signals, one of which is the inversion of the other;

first and second gate means gating said one and said other of said clock signals, respectively, against an input data signal;

first and second RC filter means connected to the outputs of said first and second gate means for yielding first and second DC outputs for adjusting loop frequency such that the edges of the clock signal pulses are equidistant from the center of the data signal pulse and no net charge is added to or removed from said RC filter means; and cross coupled diode means including a first diode connected between said first RC filter means and the output of said second gate means, and a second diode connected between said second RC filter means and the output of said first gate means, said first RC filter means discharging through said first diode during the portion of said data signal coinciding with said other clock signal, and said second RC filter means discharging through said second diode during the portion of said data signal coinciding with said one clock signal.

6. The invention according to claim 5 comprising a third diode between said first gate means and said first RC filter means in series aiding direction toward the latter, and a fourth diode between said second gate means and said second RC filter means in series aiding direction toward the latter, such that all of said first, second, third and fourth diodes are back biased in the absence of a data signal pulse and prevent current flow caused by said gate means to or from said RC filter means whereby to hold the charge of the latter until the next data signal pulse.

7. In a phase locked loop having a voltage controlled oscillator, the improvement comprising a phase insensitive frequency comparator for comparing the frequency of said loop against a reference frequency for stabilizing the former by altering the control voltage, said phase insensitive frequency comparator comprising:

and up/down counter having a first input for receiving loop frequency pulses to increment the counter one way, and having a second input for receiving reference frequency pulses to increment the counter the other way, said counter having a plurality of outputs representing different order bit positions of the accummulated count;

gate means connected to a selected combination of said outputs and responding to first and second bit combinations designating selected overflow and underflow set points of the counter and yielding first and second error correction signals to alter said control voltage to decrease and increase loop frequency.

8. The invention according to claim 7 wherein said gate means is connected to a selected pair of outputs of said counter and responds to a first unique bit pair to deliver said first error correction signal and responds to a second unique bit pair to deliver said second error correction signal, and including second gate means responsive to either of said first and second error correction signals to clear said counter back to a predetermined starting point for the next correction cycle.

9. The invention according to claim 8 wherein said first mentioned gate means includes a first gate responsive to either of said first and second unique bit combinations and second and third gates for gating the output of said first gate against a respective one of said pair of counter outputs, and including first and second transistors, base driven into conduction by respective first and second error correction signals from said second and third gates, respectively, to change said control voltage.

10. The invention according to claim 7 comprising timing means comprising:

a first flip-flop receiving loop frequency pulses;

a second flip-flop receiving reference frequency pulses;

a first gate receiving the output of said first flip-flop;

a second gate receiving the output of said second flip-flop;

connection means connecting the output of said first gate to the input of said second gate and connecting the output of said second gate to the input of said first gate such that each gate inhibits the other from assuming the same output state;

delay means connected between the outputs of said first and second gates and said first and second counter inputs, respectively; and means further connecting the outputs of said delay means to said flip-flops and said gates for clearing and enablement, such that said loop frequency pulses and said reference frequency pulses are delivered to said counter with a minimum time gap therebetween such that all said pulses are counted.

11. The invention according to claim 10 wherein said delay means comprises:

a first delay side having an input from said first gate, and, having an output connected to said first counter input, to a clear input of said first flip-flop and to an input of said second gate; and a second delay side having an input from said second gate, and having an output connected to said second counter input, to a clear input of said second flip-flop and to an input of said first gate.

12. The invention according to claim 11 wherein said first and second delay sides include separate delay gates and a common delay gate, such that said delay means removes pulse slivers resulting from the time race to said first and second gates, sets the width of the count pulse, and inhibits a count pulse from being generated on one of said first and second counter inputs until some time after the end of the count pulse on the other of said first and second counter inputs.

* * * * *